United States Patent
Prisecaru

(10) Patent No.: US 11,914,010 B2
(45) Date of Patent: Feb. 27, 2024

(54) MICROWAVE COUPLING DEVICE FOR IRIS APERTURES, COMPRISING A PLURALITY OF CONDUCTOR LOOPS

(71) Applicant: Bruker BioSpin GmbH, Rheinstetten (DE)

(72) Inventor: Ion Prisecaru, Karlsruhe (DE)

(*) Notice: Subject to any disclaimer, the term of this patent is extended or adjusted under 35 U.S.C. 154(b) by 54 days.

(21) Appl. No.: 17/391,157

(22) Filed: Aug. 2, 2021

(65) Prior Publication Data

US 2022/0050155 A1  Feb. 17, 2022
US 2022/0342015 A9  Oct. 27, 2022

(30) Foreign Application Priority Data

Aug. 12, 2020 (EP) .................................... 20190712

(51) Int. Cl.
G01R 33/345 (2006.01)
G01R 33/36 (2006.01)
(Continued)

(52) U.S. Cl.
CPC ....... *G01R 33/345* (2013.01); *G01R 33/3692* (2013.01); *G01R 33/60* (2013.01); *G01R 33/34069* (2013.01)

(58) Field of Classification Search
CPC .. G01R 33/345; G01R 33/3692; G01R 33/60; G01R 33/34069
See application file for complete search history.

(56) References Cited

U.S. PATENT DOCUMENTS 3,003,118 A * 10/1961 Kline ........................ H03B 9/10
331/86
3,076,122 A * 1/1963 Kumpfer ................. H01J 23/36
315/39.75
(Continued)

FOREIGN PATENT DOCUMENTS

CN 102780058 A 11/2012
CN 103018269 A 4/2013
(Continued)

OTHER PUBLICATIONS

Disselhorst, J A J M et al, "A Pulsed EPR and Endor Spectrometer Operating at 95 GHZ", Journal of Magnetic Resonance. Series A, Academic Press, Orlando, FL, US, vol. 115, No. 2, Aug. 1995, p. 183-188.
(Continued)

Primary Examiner — Dixomara Vargas
(74) Attorney, Agent, or Firm — Benoît & Côté, Inc.

(57) ABSTRACT

A coupling device is provided for coupling microwave radiation from a first microwave structure, in particular a microwave waveguide, into a second microwave structure, in particular a microwave resonant cavity, wherein the first and second microwave structures share a common wall, through an iris opening in said wall in front of which the coupling device is positioned on the side of the first microwave structure, in particular wherein the coupling device is of a basically cylindrical shape, characterized in that the coupling device comprises N electrically conducting conductor loops, with N≥3, preferably 3≤N≤20, that the conductor loops are arranged coaxially in an array along a z-axis, and that axially neighboring conductor loops are separated by a dielectric. The inventive coupling device allows for a larger coupling coefficient, and in particular allows for a larger dynamic range.

21 Claims, 8 Drawing Sheets

(51) Int. Cl.
*G01R 33/60* (2006.01)
*G01R 33/34* (2006.01)

(56) References Cited

U.S. PATENT DOCUMENTS

| | | | | |
|---|---|---|---|---|
| 3,080,520 | A * | 3/1963 | O'Reilly | G01R 33/345 |
| | | | | 324/636 |
| 3,896,400 | A | 7/1975 | Hyde | |
| 4,468,633 | A | 8/1984 | Chilluffo et al. | |
| 6,211,752 | B1 * | 4/2001 | Gendraud | H01P 7/06 |
| | | | | 333/230 |
| 10,353,027 | B2 | 7/2019 | Prisecaru et al. | |
| 2004/0028501 | A1 | 2/2004 | Haraldsson | |
| 2016/0274200 | A1 * | 9/2016 | Prisecaru | G01R 33/343 |
| 2016/0301123 | A1 * | 10/2016 | Solomon | H01P 1/2084 |
| 2016/0334476 | A1 * | 11/2016 | Doty | G01R 33/38 |
| 2017/0125219 | A1 * | 5/2017 | Kobayashi | H01J 37/32229 |
| 2019/0326099 | A1 * | 10/2019 | Kobayashi | H01J 37/32211 |
| 2020/0182955 | A1 | 6/2020 | Zhou et al. | |
| 2020/0241101 | A1 | 7/2020 | Porch et al. | |

FOREIGN PATENT DOCUMENTS

| | | | |
|---|---|---|---|
| CN | 103033526 | A | 4/2013 |
| CN | 103151586 | A | 6/2013 |
| CN | 204203131 | U | 3/2015 |
| CN | 105990631 | A | 10/2016 |
| CN | 107623158 | A | 1/2018 |
| CN | 108631037 | A | 10/2018 |
| CN | 110658226 | A | 1/2020 |
| EP | 3145022 | A1 | 3/2017 |
| ES | 2078172 | A2 | 12/1995 |
| JP | S57-082703 | A | 7/1975 |
| JP | H0915312 | A | 1/1997 |
| JP | 2002-050908 | A | 2/2002 |
| WO | 2009155873 | A1 | 12/2009 |

OTHER PUBLICATIONS

Gao, J., "Analytical Formulae for the Coupling Coefficient β between a Waveguide and a Travelling Wave Structure", Laboratoire de L'Accélérateur Linéaire, IN2P3-CNRS et Université de Paris-Sud, Centre d'Orsay, PAC 1993, p. 868-870.

Gao, J., "Analytical formula for the coupling coefficient ,β of a cavity-waveguide coupling system", Nuclear Instruments and Methods in Physics Research A309 (1991) p. 5-10.

Wang Hao, "Design of Automatic Frequency Control System based on Phase-Frequency Relation in Electron Paramagnetic Resonance Spectrometer", University of Science and Technology of China, 2017.

* cited by examiner

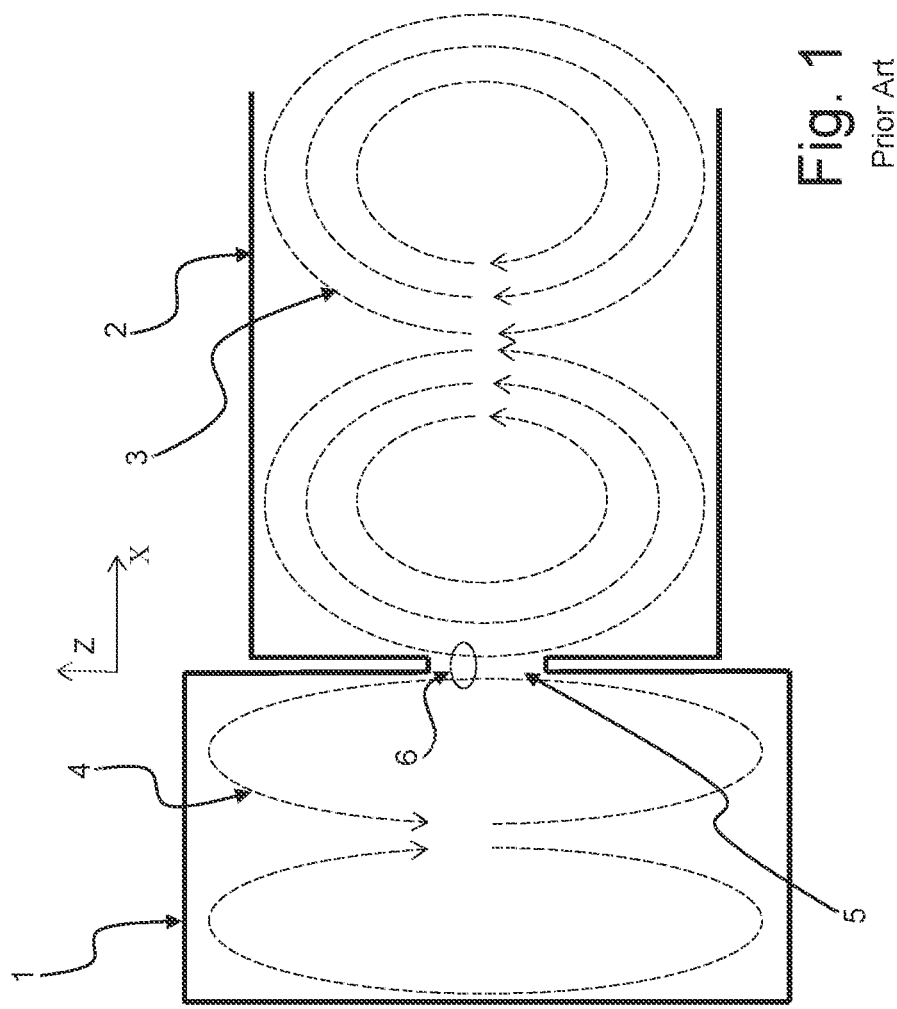

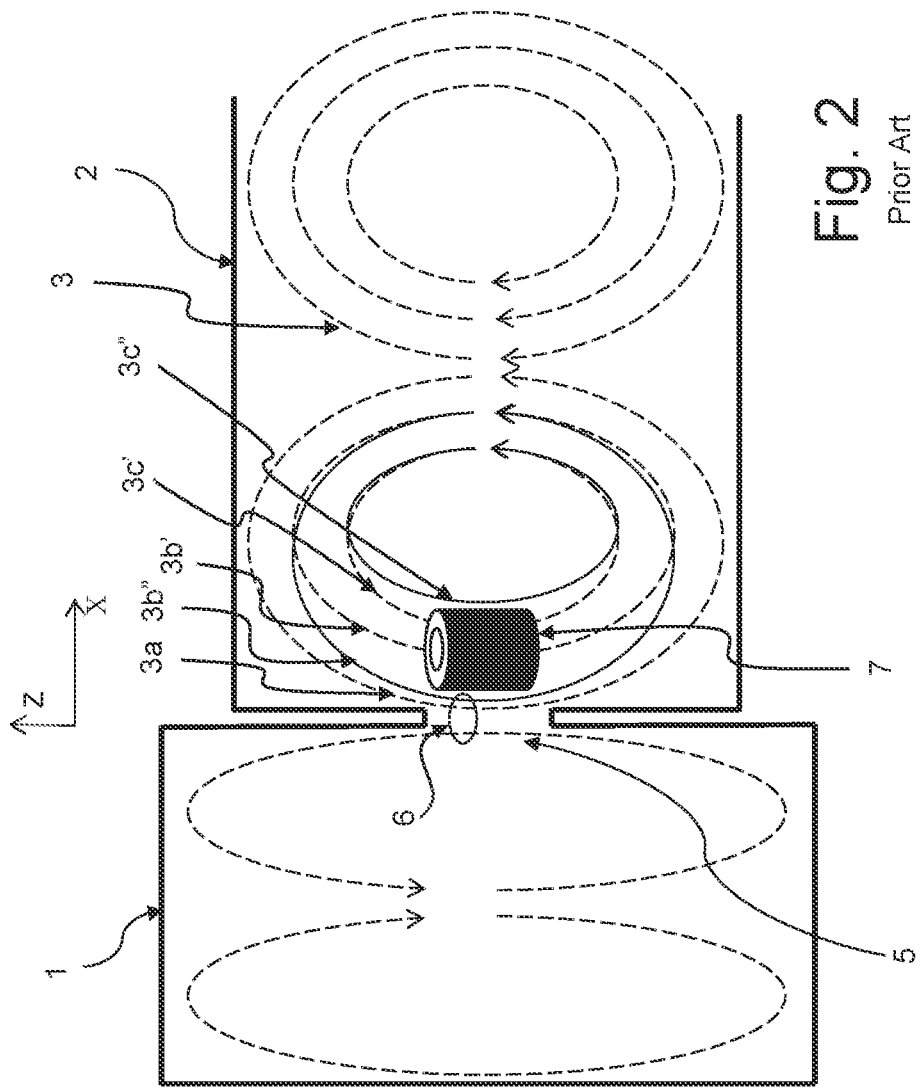

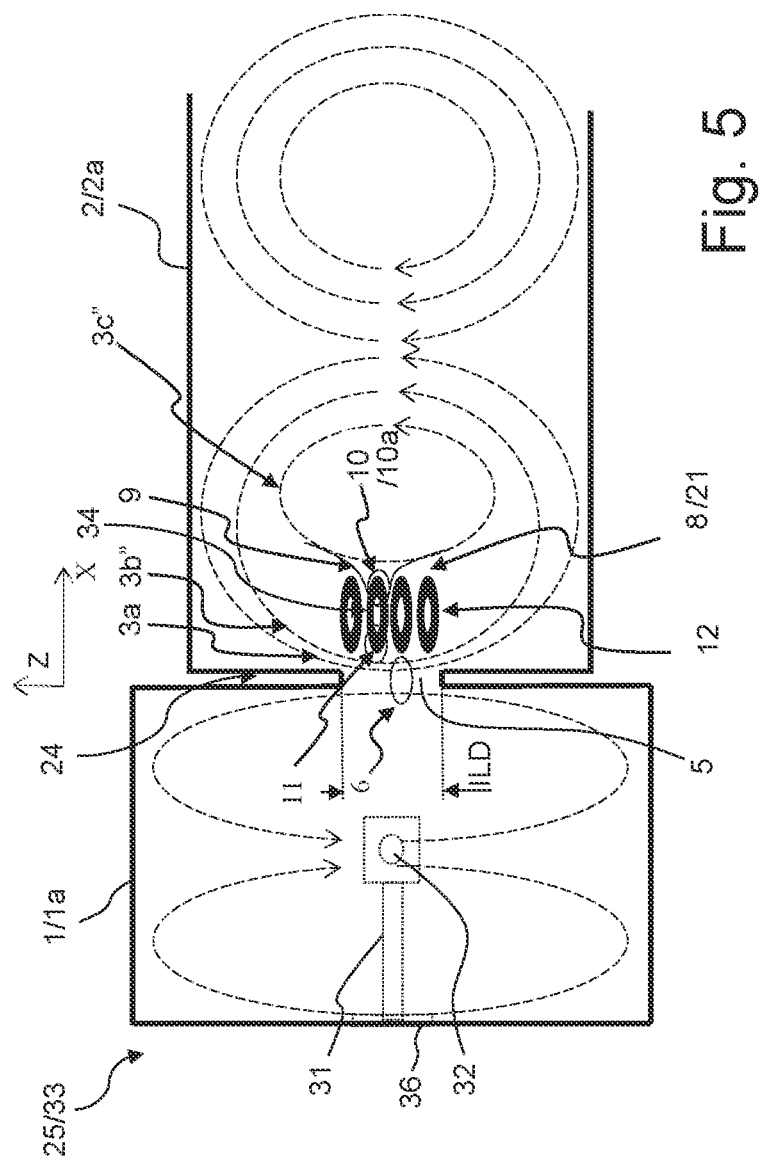

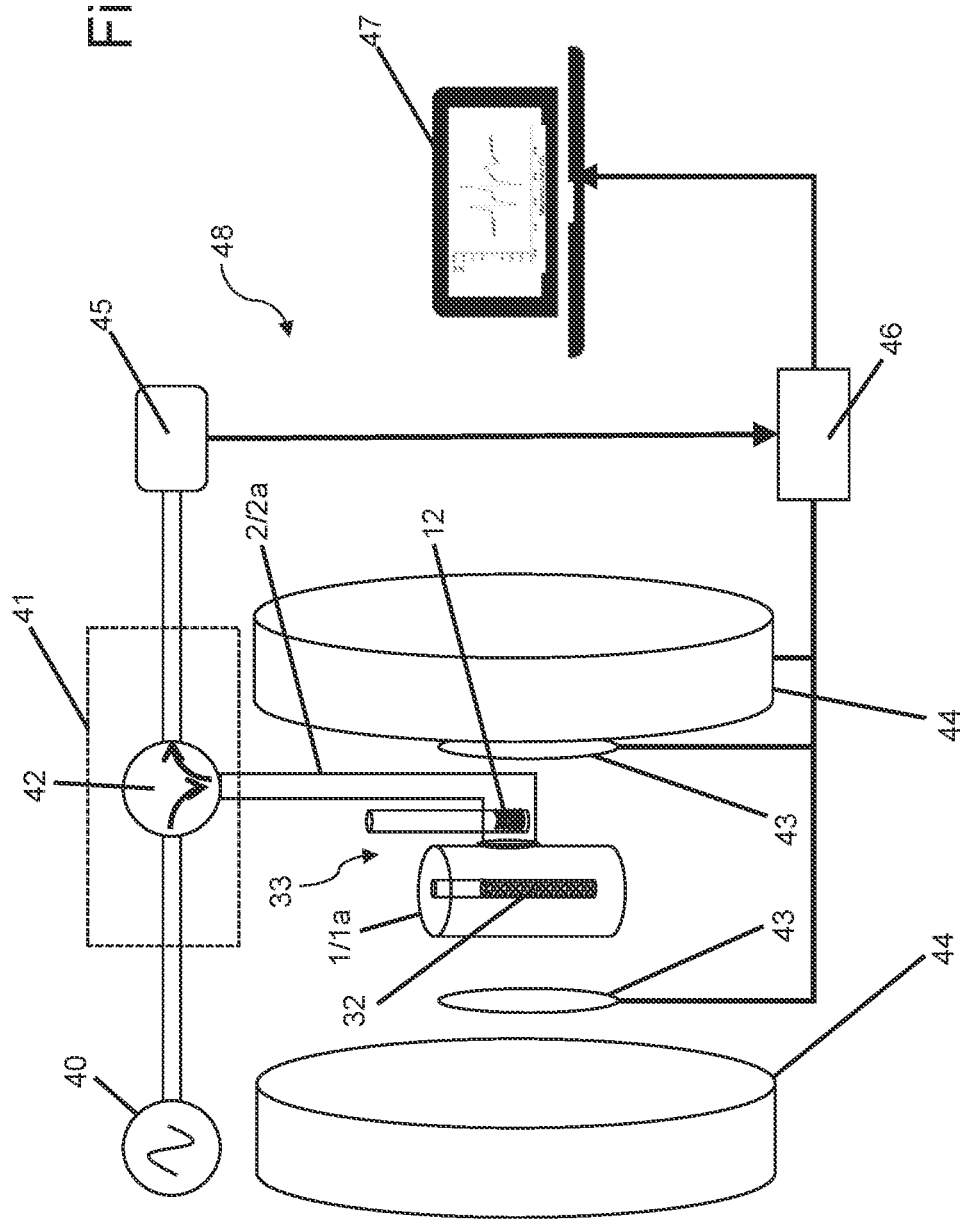

MICROWAVE COUPLING DEVICE FOR IRIS APERTURES, COMPRISING A PLURALITY OF CONDUCTOR LOOPS

BACKGROUND OF THE INVENTION

Field of the Invention

The invention relates to a coupling device for coupling microwave radiation from a first microwave structure, in particular a microwave waveguide, into a second microwave structure, in particular a microwave resonant cavity, wherein the first and second microwave structures share a common wall, through an iris opening in said wall in front of which the coupling device is positioned on the side of the first microwave structure, in particular wherein the coupling device is of a basically cylindrical shape. Such a coupling device is known from U.S. Pat. No. 3,896,400 A.

Description of the Related Art

Electron paramagnetic resonance (EPR) spectroscopy is a powerful tool for investigating samples having a paramagnetic magnetic moment, in particular having unpaired electrons. In EPR spectroscopy, the sample is typically subjected to microwave radiation with a constant frequency inside a microwave resonant cavity, and a background magnetic field is swept. The absorption of microwaves by the sample is measured and used for characterizing the sample, in particular with respect to its chemical state and molecular environment.

In order to introduce microwave radiation into the microwave resonator, it is typically fed into a microwave waveguide, wherein the microwave waveguide shares a common wall with the microwave cavity. Said wall comprises an opening, called an iris opening, through which microwave radiation may be coupled into (and out of) the microwave resonator.

For EPR spectroscopy experiments, the electromagnetic losses of the resonant cavity are of importance; the electromagnetic losses are characterized by a so-called quality factor (or Q-factor). The quality factor depends on the microwave resonant cavity as such, in particular its walls ("internal Q-factor", contribution $Q_{INT}$), and further on the iris opening, in particular its size (contribution $Q_{IRIS}$). From $Q_{INT}$ and $Q_{IRIS}$ results a so-called uncoupled quality factor $Q_U$. The quality factor can also be influenced by arranging a metallic coupling device in front of the iris opening in the waveguide; in this way, the magnetic field strength in the vicinity of the iris opening can be influenced and in particular be increased, increasing the coupling between the microwave waveguide and the microwave resonant cavity (contribution of coupling coefficient β). As a result, a so-called loaded quality factor $Q_L$ can be attributed to the microwave cavity, compare e.g. J. Gao, "Analytic Formulae for the Coupling Coefficient β between a Waveguide and a Travelling Wave Structure", Nuclear Instruments and Methods in Physics Research A330 (1993), p. 306-309 and PAC 1993, page 868-870.

Depending on the type of EPR measurement desired, different values of loaded quality factors $Q_L$ are desired. For CW-EPR (continuous wave EPR) spectroscopy, the signal of the sample is proportional to $Q_L$, so that high values of $Q_L$ are desired. In contrast, for Pulse-EPR spectroscopy, low values of $Q_L$ are desired for minimizing dead-time. Further, for some measurement, it is desired to change the coupling conditions, in particular between undercoupling, critical coupling and overcoupling. As a consequence, probe heads for an EPR measurement system should have a high dynamic range in order to allow for optimized measurement conditions for the different types of EPR measurements.

In order to alter the loaded quality factor, it is known to use a coupling device that can be moved between a position in front of the iris opening (to maximize the magnet field strength close to the iris opening) and a position away from the iris opening (to minimize the magnetic field strength close to the iris opening). In practice, practically zero magnetic field strength can be achieved close to the iris opening with the coupling device retreated. In contrast, the achievable maximum magnetic field strength $B_{max}$ in the vicinity of the iris opening, corresponding to a maximum coupling coefficient, with the coupling device placed close to the iris opening is limited, what in turn determines (for a given size of the iris opening) the lower $Q_L$ limit and the dynamic range.

U.S. Pat. No. 3,896,400 describes a coaxial line to microwave cavity coupling section, wherein a metallic stud is arranged on a dielectric screw. The position of the stud in said section is adjustable by turning the screw.

CN 103 033 526 A describes a cylindrical electron paramagnetic resonance probe head with a detecting port, for example for arrangement on a tooth of a patient. A coupling and tuning unit is arranged in front of a coupling hole. For tuning the coupling constant, the coupling and tuning unit comprises a metal cap attached to the end of a threaded non-metallic tuning bolt.

SUMMARY OF THE INVENTION

The present invention provides a coupling device which allows for a larger coupling coefficient, and in particular allows for a larger dynamic range. This is achieved, in accordance with the invention, by a coupling device like those described above, characterized in that the coupling device comprises N electrically conducting conductor loops, with N≥3, preferably 3≤N≤20, that the conductor loops are arranged coaxially in an array along a z-axis, and that axially neighboring conductor loops are separated by a dielectric.

In accordance with the invention, the coupling device can distort a microwave magnetic field when placed close to the iris opening in the common wall of a first and second microwave structure.

The coupling device can, in a similar way as compared to for example a full metal stud, shift (redistribute) magnetic field lines running basically along the z direction from an interior region of the coupling device to outside the coupling device and thus closer to the iris opening, as compared to a situation without the coupling device (or with the coupling device retreated from the iris opening).

However, in addition, microwave magnetic field lines propagating basically perpendicular to the z axis can penetrate into the interior of the coupling device between the conductor loops separated in the direction of the z axis. The dielectric separating the conductor loops do not block this "radial" microwave magnetic field, or at least block it only to a small extent. This effect can be used to redistribute further microwave magnetic field lines to the vicinity of the iris opening, thus increasing magnetic field strength there and therefore increasing the coupling coefficient established by the inventive coupling device. More specifically, magnetic field lines close to the side of the coupling device facing away from the iris opening can be distorted to loop (form a linkage) into the inner volume of the coupling device, using the dielectric axial gaps between the conductor loops, resulting in induced secondary loops on the side of the coupling device facing the iris opening, which contribute to the magnetic field strength achievable there. With the inventive coupling device, a higher $B_{max}$ value can be achieved in the vicinity of the iris opening, as compared to full metal studs or axially bored studs.

With the inventive coupling device, particularly low $Q_L$ values may be achieved with the coupling device placed in front of the iris opening. In turn, when switching between a position of the coupling device (centrally) in front of the iris opening and a position retracted from the iris opening (where practically only the dimensions of the microwave resonant cavity/second structure and the dimensions of the iris opening are relevant for the quality factor), a particularly high dynamic range of $Q_L$ values may be achieved.

The conductor loops are arranged in an array along the z direction, which in use is typically in parallel with the common wall of the first and second microwave structure, and typically also in parallel with a long axis of the iris opening. The coupling device is typically of a basically cylindrical shape, but may also have non-cylindrical shape, in particular with an oval or rectangular shape in cross-section (perpendicular to the z-axis).

Typically, the coupling device has a central empty bore along the z-axis (with air or vacuum as dielectric there); alternatively, the center region along the z-axis may be filled with a solid dielectric.

The conductor loops are typically equally spaced along the z-direction, but the spacings may also be chosen unequally. The loops are typically annular, but may also be helical or both combined. The conductor loops are typically made of a non-magnetic metal, such as silver or aluminium.

The dielectric is an electric insulator, and may comprise one or more plastic materials and/or one or more ceramic materials and/or gas and/or air and/or vacuum. The dielectric may comprise different sections of different (dielectric, non-metal) materials, including air and vacuum.

In a preferred embodiment of the inventive coupling device, the conductor loops and the dielectric are chosen, dimensioned and arranged such that microwave magnetic field axial propagation along the z-axis is below cutoff-condition, so microwave magnetic field lines parallel to the z-axis cannot enter an inner volume of the coupling device. If microwave magnetic field lines parallel to the z-axis cannot enter the inner volume of the coupling device, magnetic field lines parallel to the z-axis have to concentrate outside the coupling device, and thus in the vicinity of the iris opening. This makes the redistribution of microwave magnetic field lines particularly efficient, and particularly high $B_{max}$ values in the vicinity of the iris opening (and thus a high coupling coefficient) may be achieved. The cutoff-condition should be satisfied at least at the microwave radiation frequency at which the coupling device shall be used. It is satisfied at least for microwave radiation frequencies in an interval between 1 GHz and 300 GHz.

In another preferred embodiment, the conductor loops and the dielectric are chosen, dimensioned and arranged such that microwave magnetic field propagation between axially neighboring loops into an inner volume of the coupling device is possible, so local microwave magnetic field line loops around individual conductor loops may be formed for linking a microwave magnetic field in the first microwave structure and a microwave magnetic field in the second microwave structure via the coupling device. Local magnetic field line loops are symmetrically built both on the side facing away from the iris opening, where they may have their origin as a distortion of microwave magnetic fields running circularly inside the first microwave structure for example in the xz plane, and on the side facing the iris opening, where their part outside the coupling device may contribute to a high $B_{max}$ value. Accordingly, $B_{max}$ and the coupling coefficient can be increased this way. This (additional) linkage condition should be satisfied at least at the microwave radiation frequency at which the coupling device shall be used. It is satisfied at least for microwave radiation frequencies in an interval between 1 GHz and 300 GHz.

A preferred embodiment provides that the conductor loops are formed as conductor windings of a continuous helical conductor structure. This is relatively simple to implement, with a single dielectric support structure and a single helical wire wound around it. Note that continuous helical conductor structures may be built self-supporting, without a solid support structure, if desired.

In another preferred embodiment, the conductor loops are formed as closed conductor rings, which are electrically insulated from each other. The closed rings, each of which is typically arranged in a plane perpendicular to the z axis, are particularly efficient in expelling magnetic field lines running parallel to the z axis and simple to implement.

Highly preferred is an embodiment providing that the coupling device comprises a support structure on which the conductor loops are arranged, wherein the support structure is made from the dielectric. The support structure simplifies the handling of the coupling device, in particular when moving it for altering the (loaded) quality factor $Q_L$. The support structure may facilitate the electric insulation of conductor rings, or may help in avoiding unwanted non-circumferential axial short-circuits between conductor windings. The support structure may be of cylinder shape, with metal coatings on its outer surface, in particular forming a plurality of separate, closed rings. The support structure may be of a cylinder shape having a thread shaped groove ("thread"), in which a metallic material is arranged or deposited, in particular with a metal wire wound on a dielectric screw. The support structure may be a one part structure, or a multi part support structure e.g. comprising a plurality of dielectric discs separating axially stacked slotted metal discs forming ring type conductor loops.

In a preferred further development of this embodiment, the coupling device comprises a movement mechanism for moving the support structure along the z-axis. In this way, the coupling coefficient may be changed in a convenient way, for adapting a microwave coupling assembly to different applications, in particular CW-EPR or pulsed EPR, or different coupling conditions. With the movement mechanism, the coupling device may be moved in front of or away from the iris opening. Translational movement is preferred because it can use all shapes (oval, rectangular, circular) of coupling devices and it is less critical with respect to a possible imprecise shape due to inaccurate manufacturing; circular (screw) movement generally requires very precise cylinder shape of both the loops and the dielectric support structure.

A preferred embodiment provides that the array of conductor loops has a length L along the z-axis, that the array has a maximum outer diameter MOD in a plane perpendicular to the z-axis, and that $0.5 \leq L/MOD \leq 10$. With shapes in this range, high coupling coefficients may be achieved, and access for radially entering microwave magnetic field lines may be accomplished easily.

A particularly preferred embodiment provides that the array of conductor loops has a length L along the z-axis, that each of the conductor loops have a minimum inner diameter MID in a plane perpendicular to the z-axis, and that L>2*MID. This is useful in efficiently achieving the cut-off (evanescent) condition in the coupling device, and thus forcing the shifting (redistribution) of the magnetic field lines from the interior of the coupling device to the exterior of it in a focused manner, hence in achieving high coupling coefficients or a $B_{max}$ in the vicinity of the iris opening.

Further preferred is an embodiment wherein the conductor loops are made from a conductor stripe having a local axial extension $H_{ring} \geq 3*\delta$, with $\delta$: skin depth of the microwave radiation. This is useful in providing sufficient penetration (until high evanescent field attenuation is achieved) of microwave magnetic field through the volume of the conductor loop into the coupling device, and thus to enforce the cutoff behaviour, in particular in the case of metal rings as conductor loops. The skin depth condition should be satisfied at least at the microwave radiation frequency at which the coupling device shall be used. It is satisfied at least for microwave radiation frequencies in an interval between 1 GHz and 300 GHz. Typically, a conductor stripe (piece of conductor material) is continuously electrically conductive around its full perimeter (in cross-section perpendicular to their local progression direction).

Further preferred is an embodiment, characterized in that the local axial extension $H_{diel}$ of the dielectric separating neighboring conductor loops is chosen such that $H_{diel} \geq R-W_{ring}/(3*\varepsilon_{diel})$, wherein the conductor loops are made from a conductor stripe having a local radial width $RW_{ring}$, and the dielectric has a relative electric permittivity $\varepsilon_{diel}$. This establishes an efficient radial propagation of microwave magnetic field into the coupling device between the conductor loops. The relative dielectric permittivity $\varepsilon_{diel}$ is measured axially between the conductor loops. Note that, typically, $H_{diel}$ is at least 100 µm, and often at least 500 µm.

Also within the scope of the present invention is a microwave coupling assembly, comprising
 a first microwave structure, in particular a microwave waveguide,
 a second microwave structure, in particular a microwave resonant cavity, wherein the first and second microwave structures share a common wall,
 an iris opening in said common wall, connecting the first microwave structure and the second microwave structure,
 and an inventive coupling device as disclosed above, positioned in the first microwave structure in front of the iris opening. With the microwave coupling assembly, both high (maximum) coupling coefficients (corresponding to a low $Q_L$ value) and a large dynamic range of possible $Q_L$ values may be achieved. The coupling device should be placed at an optimum and sufficient distance from the walls of the first microwave structure, at least to ensure electric insulation. Typically, the distance between the iris opening and the coupling device is in a range between 0.1 mm and 2 mm (in the x direction), preferably between 0.2 mm and 0.5 mm. For this range, a coupling efficiency twice as high as in the state of the art may be achieved. However, the manufacturing tolerance may be a limiting factor here. The iris opening typically has its longest diameter along a long axis, which is oriented parallel to the z-axis. The iris opening is typically rectangular or elliptical.

In a preferred embodiment of the inventive microwave coupling assembly, the array of conductor loops has a length L along the z-axis, and the iris opening has an extension ILD along the z-axis, with $0.2*ILD \leq L \leq 2*ILD$. In this way, high maximum coupling efficiency may be achieved.

In another preferred embodiment, the microwave coupling assembly comprises a movement device for moving the coupling device along the z-axis within the first microwave structure, in particular wherein the movement mechanism comprises a screw or a guide member. With the movement device, the position of the coupling device relative to the iris opening may be changed in a convenient way, in order to adapt to different applications, such as to CW-EPR and pulsed EPR, or different coupling conditions. The movement mechanism may be motorized. By means of the movement device, the coupling device or its array of conductor loops, respectively, can be moved in particular between a first position centrally in front of the iris opening to a second position fully retreated from (non-overlapping with) the iris opening.

Further within the scope of the present invention is a probe head for an electron paramagnetic resonance (EPR) measurement system, comprising an inventive microwave coupling assembly as described above, wherein the second microwave structure is a microwave resonant cavity comprising at least one opening for an EPR sample and a sample holder, and wherein the first structure is a microwave waveguide. This probehead may be used for achieving extremely low or high $Q_L$ values, and at the same time allows for a large dynamic range of $Q_L$ values for the chosen iris dimension.

Finally, also within the scope of the present invention is the use of an inventive probe head as described above in an EPR measurement,
 wherein an EPR sample is arranged at the sample holder in the microwave resonant cavity,
 wherein microwave radiation is fed into the microwave waveguide and coupled into the microwave resonant cavity through the iris opening assisted by the coupling device, wherein magnetic field lines of the microwave radiation in front of the iris opening are parallel to the z-axis,
 wherein microwave magnetic field axial propagation along the z-axis is below cutoff-condition of the coupling device, so microwave magnetic field lines parallel to the z-axis do not enter an inner volume of the coupling device,
 and wherein microwave magnetic field propagation between axially neighboring loops into the inner volume of the coupling device takes place, so local microwave magnetic field line loops around individual conductor loops are formed and link a microwave magnetic field in the first microwave structure and a microwave magnetic field in the second microwave structure via the coupling device. With this use, a particularly high coupling coefficient may be achieved, in particular for pulse-EPR. In general, it is desired to maximize the microwave magnetic field propagation between axially neighboring loops into the inner volume of the coupling device, for efficient linkage. The microwave radiation is chosen with a (constant) frequency of between 1 GHz and 300 GHz. Note that the microwave resonant cavity is placed in a static magnetic field, which is swept between the measurement points, and the (resonant) microwave absorption of the sample for each measurement point (magnetic field point) is measured. Microwave main propagation in the waveguide is perpendicular to the Z-axis. Preferred is the TE10 propagation mode in rectangular waveguides.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

FIG. 1 shows a schematic cross-section of a prior art coupling assembly with a waveguide and a microwave cavity and an iris opening without a coupling device.

FIG. 2 shows a schematic cross-section of a prior art coupling assembly with a waveguide and a microwave cavity and an iris opening with a conventional coupling device.

FIG. 5 shows a schematic cross-section of an exemplary coupling assembly in accordance with the invention, with a waveguide and a microwave cavity and an iris opening and an inventive coupling device having four conductor loops.

FIG. 9 shows a schematic illustration of an EPR measurement system for the invention.

DETAILED DESCRIPTION

Figure 4:
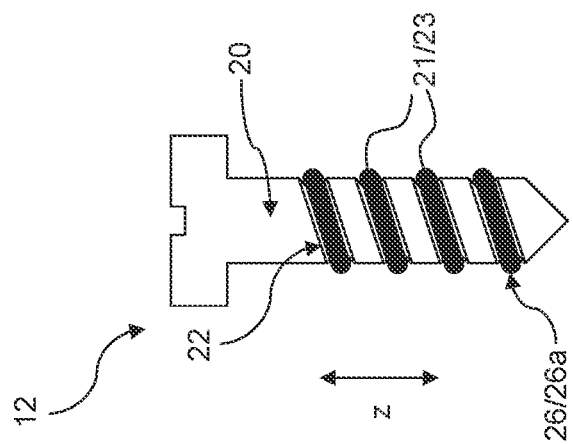
FIG. 4 shows a schematic side view of an inventive coupling device, with a plurality of conductor loops formed as conductor windings of a solenoid.

The invention is directed to a new type of microwave coupling device suitable for end-launch iris type apertures in waveguides that provides significantly more magnetic field flux in the near vicinity of the iris, hence increasing the coupling dynamics. The performance is realized by achieving simultaneously the same level of field flux focusing (density) obtained by traditional methods, yet completed by a new way to bring in the vicinity of the iris aperture more magnetic field flux contributions which were previously unused. The preferred embodiment involves use of a stack of metallic rings interleaved with a stack of dielectric discs such to provide a propagation regime in the direction of TE10 propagation, i.e. through the stack of rings and perpendicular to the axis of rings. This functionality is accomplished by allowing each metallic ring in the stack to be linked with more incident flux lines from waveguide. This linkage, which cannot be established in the prior art, is further transmitted by the said stack of metallic rings to the iris aperture, therefore improving the overall coupling strength.

The present invention increases the coupling strength of an iris type connecting aperture (iris opening) between two separate microwave regions (microwave structures). This involves increasing the electromagnetic flux linkage through the iris opening and, relative to the functionality of microwave coupling devices that are used in EPR spectroscopy, in this disclosure the analysis of the coupling dynamic capability is also included.

For explanatory purposes of all sections in this disclosure we can consider a particular situation where the microwave power must be transmitted from a feeding metallic waveguide (first microwave structure) into a microwave resonant cavity (second microwave structure). Those skilled in the art can easily recognize that the generality of the problem is not lost by this specific choice of exemplification case, and the solution for this new coupling device can be easily applied to other similar problems such as transfer of microwave power, via end launch iris opening, from said feeding waveguide to another waveguide, or microstrip or coaxial transmission line.

For simplicity, it is assumed that the resonant microwave cavity is considered as being enclosed with metallic walls, and that the internal Q-factor (here named $Q_{INT}$) of the cavity is not a parameter, hence all internal Q-factor values are possible if needed.

It is further assumed that this cavity is connected to the feeding waveguide by an iris aperture (iris opening), which essentially can be described as a fixed size physical opening hole in the metallic walls of the cavity (see FIG. 1). The iris aperture orifice is generally rectangular (or elliptical) and aligned along the Z-axis.

In FIG. 1 is shown the B-field linkage 6 (coupling) inside and in the vicinity of the iris opening 5 (aperture) for microwave coupling between a waveguide 2 and a microwave resonant cavity 1. The microwave B-field lines 3 in the waveguide 2 and the microwave B-field lines 4 in microwave cavity 1 are shown as dashed lines. X designates the direction of microwave field propagation in the waveguide and Z is the direction of long dimension for the iris opening 5. For good coupling, the long dimension of the iris opening 5 is the same direction with microwave B-fields 3 and 4 in the vicinity of the aperture.

For bandwidth purposes, the dimension of the iris opening must be sufficiently short in the Z direction to define under cut-off (evanescent) x-axis propagation inside the opening. For low loss purposes, it must be sufficiently short in the X direction to have a low evanescent attenuation.

The iris opening can have typical dimensions, geometry and placement. Here these parameters should be selected, by prior art methods, to provide a theoretically maximum coupling (linkage) between magnetic flux passing through the aperture and magnetic flux lines of for a given operating microwave resonance mode of the cavity. It should be easy to recognize that the iris opening will disturb electric current lines on the surface of the cavity walls, this being equivalent to a perturbation of the microwave resonance mode, which in turn can be associated with a definite microwave loss of energy. For example it is straightforward to understand it as the work contribution necessary to adapt the current lines on their new traces that will circumvent the iris opening, but note that other contributions to this microwave loss mechanisms can exist, too (in essence all surface current lines that characterize the resonance mode will be perturbed by the presence of the iris hole, decreasing the overall mode symmetry in the cavity and hence increasing losses).

To better describe this aspect, one may leave unchanged the definition of $Q_{INT}$ and define instead a new measurable (indirect) quantity that describe the quality factor associated with the perturbation brought by the iris opening inside the cavity (here named $Q_{IRIS}$).

If we assume, without breaking the generality in what concerns the analysis below, that we restrict the iris opening geometry to a rather thin rectangular aperture (i.e. the optimal aperture shape for connecting a microwave transmission device (waveguide) with the cavity), then we can propose the following approximation, that is valid from our experience:

$$\frac{A_{IRIS}}{A_{RES}} \sim \frac{1}{Q_{IRIS}}$$

where the $A_{IRIS}$ is the area of iris opening and ARES is the total area of cavity metallic walls.

Together these two contributions of electromagnetic losses from both the cavity ($Q_{INT}$) and from its iris opening ($Q_{IRIS}$) allow us to define the unloaded quality factor of the cavity (here named $Q_U$) in a suitable form:

$$\frac{1}{Q_U} = \frac{1}{Q_{INT}} + \frac{1}{Q_{IRIS}}$$

For typical EPR spectroscopy applications it is required that a microwave coupling device be used in a design such as to provide a variable coupling, i.e. to modify the loaded quality factor (here named $Q_L$) by formula:

$$Q_L = \frac{Q_U}{(1+\beta)}$$

where β is the coupling coefficient. This requirement is needed, for example, to bring the EPR cavity in critically coupling for all situations when the cavity parameters are changed: inserting or changing various cavity tuning inserts, inserting RF-coils, insertion and measurements of various EPR probe samples (which might be more or less lossy) etc.

A typical design requirement for cavities used in high sensitivity EPR spectroscopy measurements is to be able to continuously vary the $Q_L$ values at least in the range from 15000 down to 750 or less. The $Q_L$ variation range (here named "coupling dynamic", and which in this case would be 20:1) reflects the dynamic of the coupling coefficient β. To be more precise, the coupling dynamic is the $Q_L$ range (or the ratio of its top and bottom limits) that is possible to be critically coupled to the microwave cavity.

In textbooks and academic scientific work the coupling coefficient β is shown to be dependent on a major parameter: the surface integral of magnetic field flux (for linkage purposes) at the iris opening area. In practice this can be further split in two parameters: the magnetic flux density (B, with SI units in T) at the iris opening and the area of the iris opening ($A_{IRIS}$). The first parameter (flux density) is typically a variable parameter that can be modified during the experimental setup by means of a sliding microwave device (here named "microwave coupling device"). The latter parameter (aperture area) has a fixed mechanical value and is simply adjusted (usually during design and production, i.e. is permanently set) to achieve the lower boundary design requirement for $Q_L$. However, as previously noted, a larger area for the iris opening will also decrease the $Q_{IRIS}$ which in turn will have a negative impact by limiting the maximum value obtainable for $Q_U$. The following equation is useful to complete our analysis of microwave coupling dynamic:

$$\beta \sim 1 + B \cdot A_{IRIS}$$

where the field flux density B at the iris opening is a variable parameter during device operation and take values from 0 up to a value $B_{max}$ determined by the "microwave coupling device" hence by microwave design.

In conclusion, after suitably rearranging all above equations:

$$Q_L = \frac{1}{(2 + B \cdot A_{IRIS})} \cdot \frac{1}{\frac{1}{Q_{INT}} + \frac{A_{IRIS}}{A_{RES}}}$$

indicates that the underlying problem to be solved by this invention, i.e. the increase of coupling dynamic range, depends on only two design parameters: $A_{IRIS}$ (to be minimized, for achieving large $Q_L$ or $Q_U$ values with the coupling device retracted) and $B_{max}$ (to be maximized, for achieving small $Q_L$ values with the coupling device in use). Keeping the $A_{IRIS}$ fixed but increasing the coupling dynamic, or keeping the coupling dynamic fixed but increasing the $Q_L$ top limit via decreasing the $A_{IRIS}$ necessarily means that the critical resonator technology requirement needed for such improvements is to obtain new design solutions for higher $B_{max}$ at the iris opening.

The problem of coupling microwave energy from a feeding rectangular waveguide into a standing-wave, a slow-wave or travelling wave type of cavity through an iris opening (opening in the metallic wall that separates the waveguide from cavity) has been extensively and intensively studied. The microwave coupling is one of the fundamental problems in microwave engineering and the results of its solutions have deep and strong implications in the overall performance of the products.

One major class of solutions for microwave coupling problem is based on iris openings in metallic walls between waveguide and cavity. Note that with waveguides and cavities, their behavior depends on their excited mode.

For determining the design details of iris openings, one of the results worth mentioning was to determine the ideal position of the iris opening in both waveguide and cavity, and also its ideal shape and geometric parameters, in correlation with the microwave transmission mode used in the waveguide and with the resonance mode used in the cavity (compare J. Gao, "Analytic Formulae for the Coupling Coefficient β between a Waveguide and a Travelling Wave Structure", Nuclear Instruments and Methods in Physics Research A330 (1993), p. 306-309 and PAC 1993, page 868-870). In the present invention this aspect was not considered a parameter and it is assumed that any solution will treat the iris shape and placement problem in a scientifically correct and an engineering optimal manner.

In the current invention, attention was given to the other critical aspect: increasing the flux density B at the iris opening. Previous academic works have shown that the values of this parameter correlate with the function of a matching circuit, hence the capability to provide undercoupling, critical coupling and overcoupling.

A classical prior art solution is to use a microwave coupling device (full metallic cylinder, rod, ball or screw) in front of the iris opening in the waveguide area, that has the role to focus the magnetic field lines (increase the flux density B) onto the iris, and hence to increase the coupling strength (see, e.g., FIG. 2).

A sub-variant of this solution, which is specific for several specific applications (for example EPR spectroscopy), added the functionality requirement for a variable microwave coupling, hence the possibility for matching the cavity under a large spectrum of loads. The new parameter "coupling dynamic" was introduced in requirements and microwave designs tried to realize it and improve it.

In the prior art, one of the best available technical solutions is a microwave coupling device in the shape of a metallic cylinder which is placed in front of the iris opening and which is movable in Z-direction. Variable coupling functionality is realized by translating the coupling cylinder device along the long axis of the waveguide cross-section that works on a standard TE10 mode. A conventional coupling device 7 is shown in FIG. 2 together with magnetic flux density B-field lines 3 to describe the physical mechanism for obtaining a variable coupling. The microwave coupling device 7 is of broadband type (i.e. non-resonant, non-tuned around the operation frequency of the cavity). In its fully protruded position (central, fully sitting in front of iris opening 5, shown in FIG. 2) the microwave coupling device 7 increases the flux density at the iris opening to $B_{max}$ value. In its fully retracted position (not shown in FIG. 2, e.g. with the coupling device 7 moved in the −z direction to the bottom of the waveguide 2 or even out of the waveguide 2), the flux density at the iris opening is set close to 0 value (i.e. in undercoupling mode).

FIG. 2 illustrates schematically the coupling between a waveguide 2 and microwave cavity 1 via an iris opening 5 using a cylindrical metallic coupling device 7 either made of full metal or with an internal bore that satisfies under cutoff conditions to implement the variable coupling. The coupling device 7 can slide along the z-axis inside the waveguide 2 and in front of iris opening 5 to realize variable coupling. Its central position corresponds to a maximum coupling factor, while a fully extracted coupling device represents the minimum coupling factor obtained.

FIG. 2 in particular shows the coupling device 7 and magnetic flux density B lines 3 to describe the physical mechanism for its focusing effect in a rectangular waveguide 2 using TE10 propagation mode. The B-field lines 3 can be distinguished according to their coupling or non-coupling comportment:

3*a* indicates microwave B-lines in the waveguide 2 passing originally in the vicinity of the iris opening 5 and not disturbed by coupling device 7.

3*b*' indicates microwave B-lines in the waveguide 2 before inserting the coupling device 7.

3*b*" indicates microwave B-lines 3*b*' in the waveguide 2 that are now disturbed by inserting the coupling device 7 (they cannot pass through the inside of coupling device 7 as it is under cutoff condition): now these lines are forced to pass as focused between the iris opening 5 and the coupling device 7 hence contributing now more efficiently to linkage 6.

3*c*' designates microwave B-lines in the waveguide 2 passing originally far from the iris opening 5.

3*c*" indicates microwave B-lines 3*c*' in the waveguide 2 which are now also disturbed by the coupling device 7. But contrary to microwave B-lines 3*b*", these field lines 3*c*" could not be focused between the iris opening 5 and coupling device 7, hence contributing now even less to linkage 6. This is a major drawback of the prior art coupling device 7 according to FIG. 2.

A further increase in the coupling factor could be achieved if the coupling cylinder in FIG. 2 was placed closer to the iris opening 5. For example, in EPR devices, the distance between the coupling cylinder and the iris opening is less than 0.5 mm, which means that if this distance were to be reduced, greater manufacturing precision would have to be provided for, because the variations in distance have a very strong effect on the microwave coupling. A higher manufacturing precision means, of course, a higher price.

Alternatively, it would be possible to increase the outer diameter of the coupling cylinder 7. This would also increase the coupling factor. However, both measures are associated with difficulties, since the space requirement of the components is already optimized to such an extent that one encounters too large variations in manufacturing tolerances.

Hence it would be desirable if the coupling factor could be increased while retaining the dimensions from the prior art. The following prior art documents use a coupling device as shown in FIG. 2:

U.S. Pat. No. 3,896,400 discloses an EPR resonator with a variable microwave coupler between a coaxial line and an EPR microwave cavity. The coupling element comprises a screw and a metallic stud. To control the amount of microwave energy coupled into the resonant cavity, the length of stud in a section leading to the cavity is adjustable.

CN 103 033 526 relates to a cylindrical electron paramagnetic resonance probe having a rectangular shape and a cylindrical microwave cavity. The coupling and tuning unit comprises a coupling bolt which serves to adjust the coupling strength. The tuning bolt comprises a metal cap is provided on the top of the coupling bolt.

This sliding metallic cylinder solution performed quite more efficiently compared with other types of microwave coupling devices (sliding metallic disks, spheres and screws) and it has been used unchanged in the past 30 years. For X-band cavities it can typically achieve a coupling dynamic from $Q_L=15000$ top boundary down to $Q_L=800$ bottom boundary.

However, many microwave applications, possibly not only the EPR spectroscopy, would benefit from obtaining an increase of the $B_{max}$ value at the iris opening.

For CW-EPR spectroscopy the signal is proportional with $Q_L$ of the cavity, hence a higher top limit value would increase the S/N and measurement sensitivity. However, the $Q_L$ bottom limit should remain at around 700. This demand for increase in coupling dynamic was not possible to be satisfied with prior art solutions (full metallic cylinders, rods, spheres or screws in the role of sliding coupling device).

For Pulse-EPR spectroscopy, the spin echo signal is time exponentially decaying, hence a decrease of the $Q_L$ bottom limit is needed to minimize the ringing time after microwave pulses, hence minimizing the dead-time of the instrument when a signal cannot be measured. However, the $Q_L$ top limit should still remain at high values, for example around 15000, because usually the Pulse-EPR cavities for measurements are required as combination CW-Pulse, with pulse behavior emphasized and optimized. But demand for an increase in the coupling dynamic is present also here and could not be satisfied with prior art solutions (full metallic cylinders, rods, spheres or screws in the role of sliding coupling device).

Maximum $B_{max}$ is achieved when a coupling device is placed exactly in front of the iris opening. Flux density inside the volume of a coupling device is designed to be evanescent (i.e., under the cut-off condition for propagation on the cylindrical axis, if the coupling device is ring-shaped) or zero (if the coupling device is designed to be totally filled with metal). The magnetic flux repelled from the inner volume of the coupling device would then be displaced to the region between the waveguide end wall (iris opening) and the outer cylindrical surface of the coupling device, hence increasing flux density $B_{max}$ at the iris opening.

To summarize, the objective of the present invention is to provide a coupling device in particular in an EPR spectrometer for coupling MW power through an orifice into the EPR resonator having an increased $B_{max}$, and providing a coupling device having a greater dynamic range.

The focus of the present invention is a microwave coupling device that is based on the general form of a hollow (axially bored) metallic cylinder, but which is further characterized by a set of parallel conductor loops (with the pieces of material belonging to a respective loop also referred to as "stripes" here), essentially oriented perpendicular to the said cylinder axis Z, and lined up along axis Z.

The set of loops may divide the cylinder into a stacked set of essentially parallel metallic (electrically conducting) annular conductor rings; in other words, the (axially bored) metallic cylinder comprises a plurality of through cuts, and what is equivalent to directly arraying perforated discs. Alternatively, the set of loops can comprise a plurality of windings of a solenoid, having the same effect; in other words, the (axially bored) metallic cylinder comprises a helical cut, and what is equivalent to directly winding a wire in a solenoid fashion.

The inner volume of the electrically conducting loops and the spacing between them should be filled with a dielectric. The dielectric (or some fraction of the dielectric) may serve as a mechanical support (if the dielectric or the fraction is solid) for each metallic loop (ring or winding), but also serves the essential microwave functions of the device, i.e. it does not have the inconveniences of the prior art cylinder (which is continuous in the z direction, and thus excludes any magnetic field propagation perpendicular to the z direction into the inner volume of the coupling device), i.e. the dielectric allows lateral microwave field penetration into the inner volume and thus additional coupling.

Figure 3:
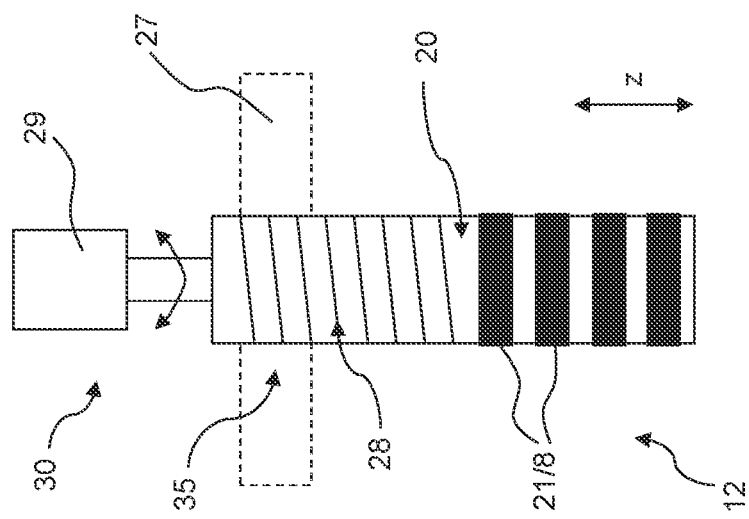
FIG. 3 shows a schematic side view of an inventive coupling device, with a plurality of conductor loops formed as closed conductor rings.

Separate annular loops (stripes) need a support structure such as a rod consisting of a dielectric material. FIG. 3 shows schematically an exemplary inventive coupling device 12 of a first type in a side view, wherein a rod-like support structure 20, made of a dielectric (electrically non-conducting) material, carries a plurality of conductor loops 21 on its outside, which are here formed as conductor rings 8. Each conductor ring 8 is of annular closed shape. The loops 21 may be manufactured, for example, as coatings (metallized surfaces) on the support structure 20. The loops 21 are arranged in a sequence along the z-axis, and are spaced apart from each other along the z-axis. The support structure 20 is typically made of a plastic material, and the conductor loops 21 are typically made of a metallic material, such as Ag or Al.

For moving the coupling device 12 along the z axis, the support structure 20 may be equipped with an outer thread 28 (such that the support structure 20 becomes a "screw"), wherein the outer thread 28 is screwed into an inner thread of a holder structure 27 (indicated with dashed lines), and turning the support structure 20 for example by a motor 29 will cause a z movement of the support structure 20 relative to the holder structure 27. If the holder structure 27 belongs to the coupling device 12, the holder structure 27 and the thread 28 can be considered a movement mechanism 35 of the coupling device 12. The holder structure 27, cooperating with said outer thread 28 of the support structure 20, and the motor 29 together can be considered as a movement device 30 for the coupling device 12.

In an alternative embodiment (not shown), the coupling device could be moved in the Z-direction by a purely translational movement. For that purpose, the coupling device can be equipped with a sliding slot for example. The main advantage of a translational movement is that manufacturing tolerances of the loops in the circumference are less important.

Solenoid structured metal loops (stripes) or wires can be self-supporting; in this variant, the dielectric can be chosen partially or completely as air, if desired. FIG. 4 shows schematically an exemplary inventive coupling device 12 of a second type in a side view, wherein a screw-like support structure 20 carries a thread 22 on its outside. A metallic wire 26a is wound about the support structure 20, and thus forms a continuous helical structure 26 having a plurality of windings 23 each going around the support structure 20. Each winding 23 represents a conductor loop 21 of the conductor device FIG. 5 illustrates an inventive microwave coupling assembly 25 by way of example, comprising a first microwave structure 2a, here a microwave waveguide 2, further a second microwave structure 1a, here a microwave resonant cavity 1, and a common wall 24 arranged between the first and second microwave structures 2a, 1a and basically oriented perpendicular to the x direction. It should be noted here that the common wall 24 may comprise two partial walls of the first and second microwave structures 2a, 1a arranged sequentially in the x direction, as shown here. The common wall 24 comprises an iris opening 5 for coupling the magnetic field in the first and second microwave structures 2a, 1 a; its dimension along the z direction is ILD, which is the longest extension of the iris opening 5. Within the first microwave structure 2a, there is arranged an inventive coupling device 12, here comprising four separate conductor loops 21 formed as closed rings 8, stacked along the z axis, and encompassing radially an inner volume 34 (or axial "bore") between its axial ends. The coupling device 12 is placed centrally in front of the iris opening 5 here, for maximizing a magnetic flux density (or magnetic field strength) in the close vicinity of the iris opening 5, and thus the coupling between the waveguide 2 and the cavity 1. The coupling device 12 can be moved by a movement device (not shown) in the z direction, and can in particular be withdrawn from (brought out of overlap with) the iris opening 5 in order to minimize the coupling between the waveguide 2 and the cavity 1. The cavity 1 may contain a sample holder 31 carrying a sample 32 to be investigated by EPR spectroscopy; the sample 32 may be inserted into the cavity 1 via an access opening 36. The coupling assembly 25 then may be used as probe head 33 for EPR measurements on said sample 32.

The coupling device 12 as shown by way of example in FIG. 5 is made of metallic rings 8. Each ring has an internal bore that satisfies under cutoff conditions for propagation on z-axis, i.e. magnetic field lines do not enter the internal bore along the z direction. The stack of rings 8 will satisfy the same condition. The inventive coupling device 12 (or the stack of rings 8) can slide along the z-axis inside the waveguide 2 and in front of the iris opening 5 to realize the variable coupling. The central position shown corresponds to a maximum coupling factor, while a fully extracted coupling device 12 represents the minimum coupling factor.

The rings 8 or their corresponding stripes should be designed such that axial propagation of the B-field along the z-axis (Z-axis of the elongated coupling device), inside the cylinder (e.g. formed partially or completely by a support structure, not shown in FIG. 5) onto which the ring-shaped stripes are arranged, is forbidden, i.e. the propagation is below cutoff; hence the microwave radiation does not penetrate into the inner space (inner volume 34) of the coupling device 12 in axial manner. In other words, the volume of the stack of rings is excluded from being filled with microwave energy from the waveguide by axial penetration.

Referring to FIG. 5, the microwave B-lines 3a and 3b" remain unchanged as compared to the situation of FIG. 2, both being focused by the new coupling device 12 similar to the prior art into the vicinity of the iris opening 5, thus contributing to linkage 6.

Cylindrical metallic rings 8 are arranged coaxially (parallel) to the z-axis (alternatively windings/turns of a solenoid along the z-axis could be used). By means of said rings 8, a different coupling can be realized. The microwave B-lines 9 represent the new distorted shape of the former 3c" microwave B-lines: now these are penetrating inside each of the rings 8 via additional linkages 10 (which form local microwave magnetic field line loops 10a) and are further contributing to the linkage 6 via the secondary linkages 11, and thus are contributing to increase the main linkage 6 to the fields in the resonator. That is, the B-field linkage 11 of each of the rings 8 contributes to the linkage 6 by transferring the energy from a respective additional linkage 10. This leads to a significantly increased coupling or increased $B_{max}$ compared to the prior art.

The new coupling device 12 is made by a stack of rings 8 or as solenoid along z-axis where each winding/turn 23 corresponds to a ring 8. In all cases, an axial core (or bore) remains free from conducting material, and space axially between neighboring conductor loops remains free from conductor material.

The cutoff condition is defined such that B-field lines do not propagate axially inside the stack of loops/rings/windings of the coupling device. Microwave field lines should be attenuated (evanescently) for under-cutoff conditions. The cutoff condition and its measurable effect is known by the skilled person and typically correlates with parameters like size of the rings, internal diameter, frequency, length or thickness, material used and its conductivity.

Axial propagation shall mean here that B-field lines of microwave radiation are parallel to the Z-axis and within the inner (cylindrical) surface of a stack/loop/ring/winding. Axial propagation does not occur under cutoff condition.

FIG. 9 shows an electron paramagnetic resonance (EPR) measurement system 48 for use with the present invention. A microwave source 40 provides microwave radiation to a microwave bridge 41, and a circulator 42 directs the microwave radiation into the microwave waveguide 2 (first microwave structure 2a). In the end part of the microwave waveguide 2, an inventive coupling device 12 is positioned in front of the iris opening 5 to the microwave resonant cavity 1 (second microwave structure 1a). Within the microwave resonant cavity 1 there is located a sample 32. The microwave waveguide 2, the coupling device 12 and the microwave resonator cavity 1 basically form an EPR probehead of the EPR measurement system The microwave resonant cavity 1 is arranged between a pair of modulation coils 43 and a pair of disc-shaped main magnet coils 44, for providing a static magnetic field in which the sample 32 is arranged.

Microwave radiation having undergone characteristic absorption by the sample 32 propagates through the microwave waveguide 2 back to the circulator 42 and is directed to a microwave detector 45. The microwave detector 45 is connected to an amplifier 46, which in turn is connected to a computer 47 acting as control and evaluation device. The amplifier 46 is also connected to the modulation coils 43 and the main magnet coils 44 for controlling purposes.

Figure 6:
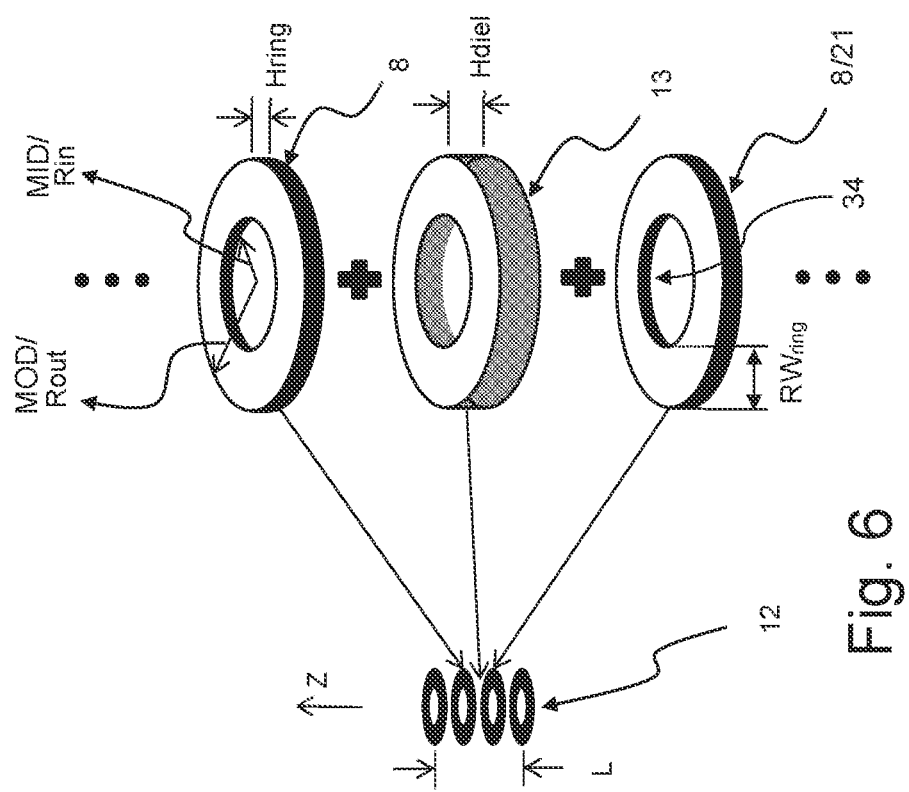
FIG. 6 shows a schematic exploded view of a coupling device according to the invention having a plurality of closed conductor rings.

FIG. 6 shows the dimensions of a coupling device 12 according to the present invention. The device 12 is defined by the following geometrical parameters:

L defines the length of the device (or stack) 12, whereas $L=N*H_{ring}+(N-1)*H_{diel}$, with $H_{ring}$: height of the stripe (piece of material) of a metallic conductor loop 21 (here ring 8, or winding), $H_{diel}$: height of the dielectric (in a particular of dielectric separators 13) arranged between the metallic conductor loops/rings/windings, N: number of metallic conductor loops/rings/windings, $R_{in}$ and $R_{out}$: inner and outer radius of the metallic conductor loops/rings/windings note that in the example of FIG. 6, $R_{in}$ and $R_{out}$ are also shared by the stack 12 and the dielectric separators 13. Note that here, $R_{in}$ is also the minimum inner dimension MID of the loops 21, and $R_{out}$ is also the maximum outer dimension of the loops 21, and the difference $R_{out}-R_{in}=RW_{ring}$ is the radial width of the loops/rings/windings.

The device 12 is further defined by the following electromagnetic parameters:

σ: metal conductivity of the conductor loops/rings/windings;

δ: microwave skin depth of the conductor loops/rings/windings, $\varepsilon_{diel}$: relative dielectric permittivity of the dielectric arranged axially between loops/rings/windings;

note that the dielectric can comprise the surroundings/air and/or a holder/support structure (if any), and that these parameters are typically shared by the entire coupling device/stack 12 and each metallic conductor loop 21/ring 8/winding.

The dielectric separators 13 can have a higher dielectric permittivity ($\varepsilon_{sep}$, corresponding to $\varepsilon_{diel}$) than surrounding and holder ($\varepsilon_{sur}$): hence $\varepsilon_{sep} \geq \varepsilon_{sur}$.

The device/entire stack 12 is defined by parameters L, $R_{in}$ and $R_{out}$. The loops/metallic rings 8 are defined by parameters $H_{ring}$, $R_{in}$ and $R_{out}$. The dielectric separators 13 are defined by parameters $H_{diel}$, $R_{in}$ and $R_{out}$.

Typically, $L>3*2*R_{in}$ to provide a cutoff condition along the z-axis for B-lines 3b" inside the cylindrical stack. For $H_{ring}>3*\delta$, this relation is generally sufficient to describe a good conductor at any frequency (δ being dependent on frequency and material parameters), hence to enforce consistent and efficient behavior of under- or over-cutoff conditions where needed. For $H_{diel}>(R_{out}-R_{in})/(3*\varepsilon_{diel})$, this relation should be chosen to provide sufficiently large undercutoff radial propagation of Bz components through the dielectric separators 13 between the adjacent set of metallic rings 8, in order to achieve significant linkage of the rings 8 with B-lines 3c".

The common parameters L, $R_{in}$, $R_{out}$ and σ provide at minimum the same microwave design and functionality as the prior art coupling device 7 from FIG. 2 above. This means that keeping the same under-cutoff microwave propagation along z will necessarily provide the identical distortion to the B field lines 3a and 3b". So, the dimensions of the coupling device and its distance from the iris opening remain the same from the prior art coupling cylinder 7 (see FIG. 2), which does not require a higher precision in manufacturing. But with the coupling device 12 according to this invention the coupling factor, however, is largely increased.

In a preferred embodiment, the spacing $H_{diel}$ between metallic conductor loops/rings/windings or their stripes, respectively, should be sufficiently large to provide that operation above cutoff is possible (e.g. range from 10 µm-2 mm; for 10 GHz: 0.5 mm; for 263 GHz: 20 µm).

Radial extension $RW_{ring}$ (with $RW_{ring}=R_{out}-R_{in}$) of the loops/rings/windings should be small enough such that they respond to avoiding too large attenuation due to the cutoff condition as disclosed above. Preferably $RW_{ring}$ should obey the condition $RW_{ring} \leq H_{diel}*3*\varepsilon_{diel}$.

Figure 7:
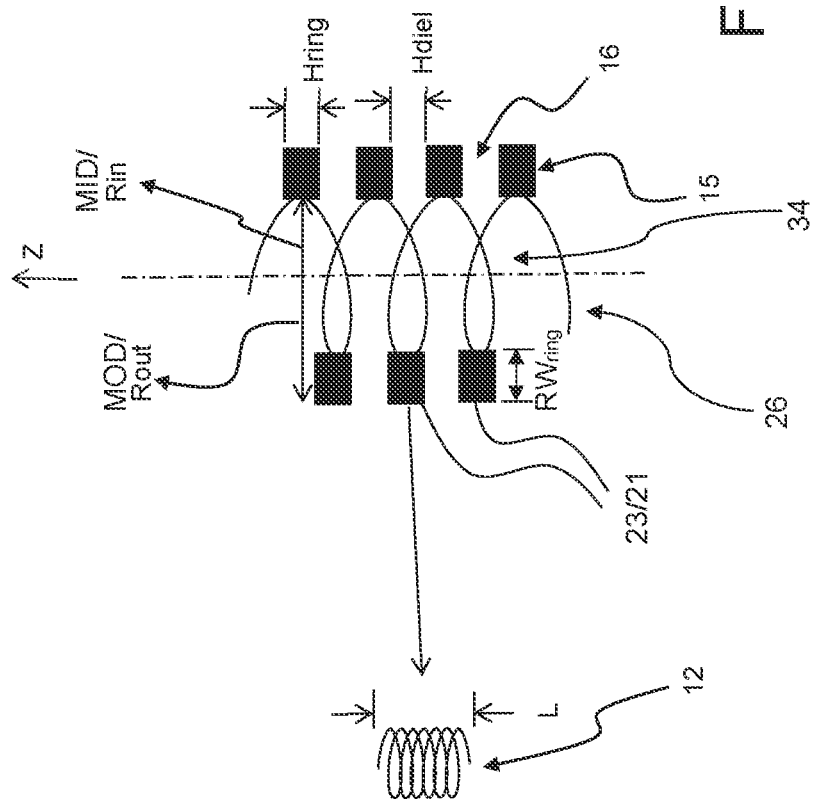
FIG. 7 shows a schematic exploded view of a coupling device according to the invention having a helical conductor structure.

FIG. 7 shows an exemplary embodiment of the inventive coupling device 12 which uses a metallic solenoid 15 (continuous helical structure 26) comprising a plurality of windings 23 as conductor loops 21 instead of a stack of separated rings. This embodiment meets the same requirements, i.e. the cutoff condition inside the solenoid 15 is maintained and the special linkages 10 and 11 contribute to couple the microwave B-lines $3c''$, thus the secondary linkages 10 and 11 work the same way as shown in FIG. 5.

This embodiment of the coupling device 12 is based on a solenoidal arrangement, described by geometry parameters ($L, R_{in}, R_{out}, H_{ring}, H_{diel}$) and materials ($\sigma, \delta, \varepsilon_{diel}$, and if applicable distinguishing $\varepsilon_{sur}$ and $\varepsilon_{sep}$). The helical structure 26 (metallic solenoid 15) is described by material ($\sigma, \delta$), by the shape of the wire, by the cross section ($H_{ring}$) and by winding parameters $R_{in}, R_{out}$ and $H_{diel}$. Dielectric support and winding separators 16 (if any) are described by geometrical parameters ($H_{diel}, R_{in}$) and material parameters ($\varepsilon_{sep}$). The definitions of the parameters according to FIG. 6 above apply the same way.

In a preferred embodiment the coupling device should be movable in the Z-direction such that the B flux density in front of the iris can be modified in particular for being capable to provide undercoupling, critical coupling and overcoupling. For example, the dielectric support structure can be threaded for being movable along the Z-axis. The possibility of modifying the flux density in front of the iris together with a higher $B_{max}$ of the coupling device leads to a higher dynamic range of the resonator.

Figure 8:
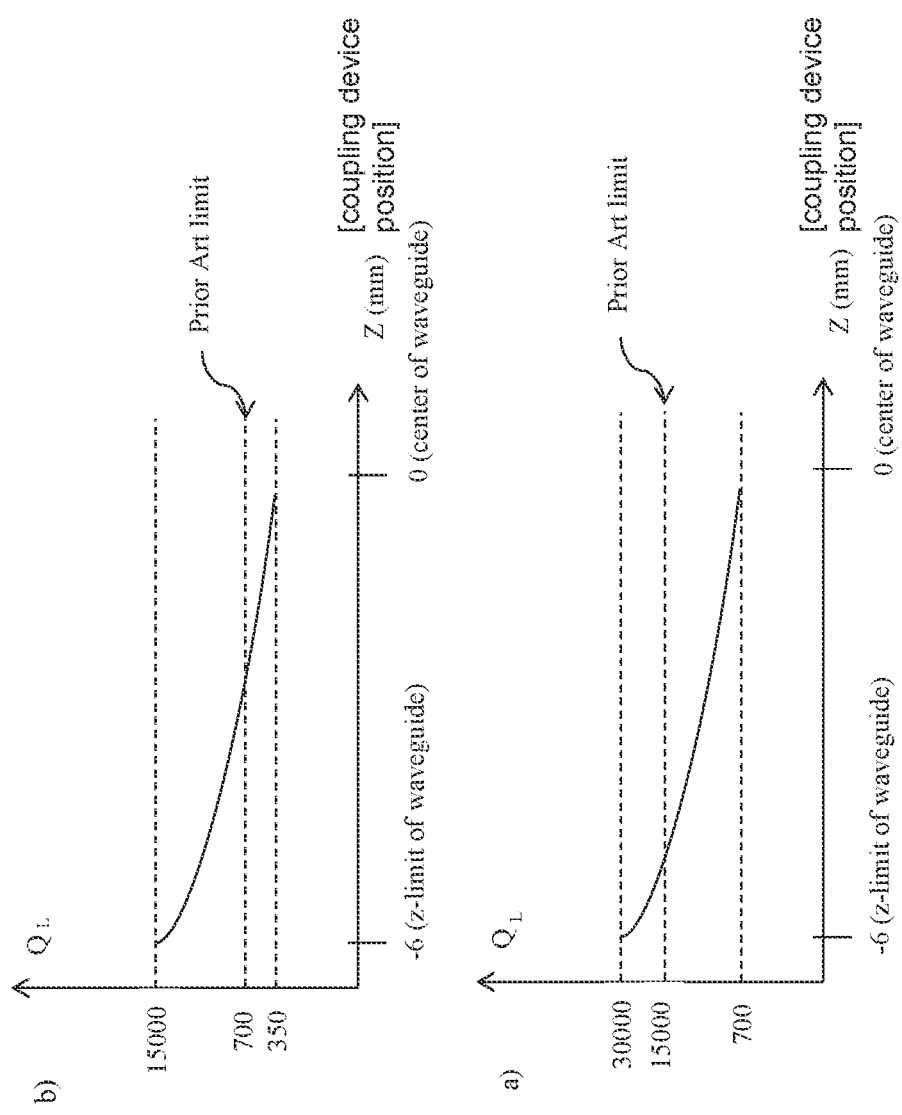
FIG. 8 shows a schematic illustration of $Q_L$ dynamic ranges achievable with coupling devices according to the present invention as compared to the prior art, with a) with extension of high $Q_L$ range, and b) with extension of low $Q_L$ range.

To exemplify the task to be solved, in FIG. 8 it is shown how the technical solution in this invention applies for two typical design requirements for high sensitivity EPR cavities:

Improvement Case 1 for low loss EPR samples: It is desired to increase the $Q_L$ top limit beyond 15000 (higher $Q_L$ means higher EPR signal, hence higher sensitivity for low loss EPR samples), but the $Q_L$ bottom limit should be kept at 700:

Prior art solution: Starting from a system with coupling dynamic 20:1 (QL from 15000 to 700), if two fold higher top limit of QL=30000 is needed then one must decrease the iris aperture AIRIS to half. If the coupling dynamic stays 20:1 or less, then the Q_L=700 bottom limit requirement will not be satisfied any more. Inventive solution: With the new design for coupling device achieving twofold improvement of Bmax, one can simultaneously decrease AIRIS to half and keep the bottom limit. The new coupling dynamic is 40:1 (30000 down to 700), as required (compare FIG. 8, part a).

Improvement Case 2 for lossy EPR samples (smaller $Q_{INT}$ also known as lower sensitivity class systems) or EPR Pulse probeheads, or RS EPR probeheads, etc.: It is desired to decrease the $Q_L$ bottom limit at 350 but the $Q_L$ top limit should be kept at 15000:

Prior art solution: Starting from a system with coupling dynamic 20:1 ($Q_L$ from 15000 to 700) if a twofold smaller bottom limit of $Q_L$=350 is needed then one must increase the iris aperture $A_{IRIS}$ twofold. The coupling dynamic stays 20:1 or less, and the $Q_L$=15000 top limit requirement will not be satisfied any more. Inventive solution: If the new design for a coupling device achieves a twofold improvement of $B_{max}$ then simply keep $A_{IRIS}$ constant. The new coupling dynamic is 40:1 ($Q_L$ from 15000 down to 350), as required (compare FIG. 8, part b).

The number of loops (rings, or in case of a solenoid the number of windings), should be at least 3, and often at least 4 loops are used. Preferably the number of rings or windings should be from 3 to 20 thus keeping the smoothness (continuity) of coupling variation.

In general, the axial spacings between loops are chosen equally, but they may also be unequal. In general, the coupling device is chosen with cylindrical shape (circular in cross-section perpendicular to the z-Axis), but also non-cylindrical device shapes are possible, for example an oval or even a rectangular shape.

For simplifying manufacture, the following steps can be taken:

For manufacturing a coupling device with solenoid stripes, it is possible to fill a groove of a threaded dielectric (dielectric support structure) with electrically conductive materials, e.g. with a conductive wire which is wound around a dielectric screw.

For manufacturing a coupling device with annular loops (conductor rings/stripes), it is possible to apply metallic coatings on dielectric bodies. For example, dielectric rings that have metallized radial outer surfaces may be stacked in alternation with non-metallized dielectric rings. The axial extension of metallization corresponds to the metallic rings. Further, metallic rings (slotted discs) may be coated on one (or both) axial end faces with a dielectric material, with the axial extension of dielectric coatings corresponding in effect to dielectric separators or cuts.

The invention claimed is:

1. A coupling device for coupling microwave radiation from a first microwave structure into a second microwave structure, wherein the first and second microwave structures share a common wall with an iris opening, the device comprising: N electrically conducting conductor loops positioned in front of the iris opening on the side of the first microwave structure, with N≥3, the conductor loops being arranged coaxially in an array along a z-axis, with axially neighboring conductor loops being separated by a dielectric.

2. A coupling device according to claim 1 wherein the first microwave structure is a microwave waveguide.

3. A coupling device according to claim 1 wherein the second microwave structure is a microwave resonant cavity.

4. A coupling device according to claim 1 wherein the coupling device is of a substantially cylindrical shape.

5. A coupling device according to claim 1, wherein the conductor loops and the dielectric are chosen, dimensioned and arranged such that microwave magnetic field axial propagation along the z-axis is below a cutoff-condition, and microwave magnetic field lines parallel to the z-axis cannot enter an inner volume of the coupling device.

6. A coupling device according to claim 1, wherein the conductor loops and the dielectric are chosen, dimensioned and arranged such that microwave magnetic field propagation between axially neighboring loops into an inner volume of the coupling device is possible, and local microwave magnetic field line loops around individual conductor loops may be formed for linking a microwave magnetic field in the first microwave structure and a microwave magnetic field in the second microwave structure via the coupling device.

7. A coupling device according to claim 1, wherein the conductor loops are formed as conductor windings of a continuous helical conductor structure.

8. A coupling device according to claim 1, wherein the conductor loops are formed as closed conductor rings, which are electrically insulated from each other.

9. A coupling device according to claim 1, wherein the coupling device comprises a support structure on which the conductor loops are arranged, wherein the support structure is made from the dielectric.

10. A coupling device according to claim 9, wherein the coupling device comprises a movement mechanism for moving the support structure along the z-axis.

11. A coupling device according to claim 1, wherein the array of conductor loops has a length L along the z-axis, and the array has a maximum outer diameter MOD in a plane perpendicular to the z-axis, such that $0.5 \leq L/MOD \leq 10$.

12. A coupling device according to claim 1, wherein the array of conductor loops has a length L along the z-axis, and each of the conductor loops has a minimum inner diameter MID in a plane perpendicular to the z-axis, such that $L > 2*MID$.

13. A coupling device according to claim 1, wherein the conductor loops are made from a conductor stripe having a local axial extension $H_{ring} \geq 3*\delta$, where $\delta$ is a skin depth of the microwave radiation.

14. A coupling device according to claim 1, wherein a local axial extension $H_{diel}$ of the dielectric separating neighboring conductor loops is chosen such that $H_{diel} \geq RW_{ring}/(3*\varepsilon_{diel})$, wherein the conductor loops are made from a conductor stripe having a local radial width $RW_{ring}$, and the dielectric has a relative electric permittivity $\varepsilon_{diel}$.

15. A microwave coupling assembly, comprising:
a first microwave structure;
a second microwave structure, wherein the first and second microwave structures share a common wall;
an iris opening in said common wall, connecting the first microwave structure and the second microwave structure, and a coupling device for coupling microwave radiation from the first microwave structure into the second microwave structure, the device being positioned in front of the iris opening on the side of the first microwave structure, and having N electrically conducting conductor loops, with $N \geq 3$, the conductor loops being arranged coaxially in an array along a z-axis, with axially neighboring conductor loops being separated by a dielectric.

16. A coupling assembly according to claim 15 wherein the first microwave structure is a microwave waveguide.

17. A coupling assembly according to claim 15 wherein the second microwave structure is a microwave resonant cavity.

18. A microwave coupling assembly according to claim 15, wherein the array of conductor loops has a length L along the z-axis, and the iris opening has an extension ILD along the z-axis, with $0.2*ILD \leq L \leq 2*ILD$.

19. A microwave coupling assembly according to claim 15, further comprising a movement device for moving the coupling device along the z-axis within the first microwave structure.

20. A probe head for an electron paramagnetic resonance (EPR) measurement system, comprising a microwave coupling assembly according to claim 15, wherein the second microwave structure is a microwave resonant cavity comprising at least one opening for an EPR sample and a sample holder, and wherein the first structure is a microwave waveguide.

21. A method of using a probe head in an electron paramagnetic resonance (EPR) measurement, the method comprising:
providing a first microwave structure having a microwave waveguide and a second microwave structure having a microwave resonant cavity with at least one opening for an EPR sample, where the first and second microwave structures share a common wall with an iris opening;
arranging an EPR sample at the sample holder in the microwave resonant cavity; and
feeding microwave radiation into the microwave waveguide and coupling the microwave radiation into the microwave resonant cavity through the iris opening with a coupling device having three or more electrically conducting conductor loops coaxially in an array along a z-axis, with axially neighboring conductor loops being separated by a dielectric, such that magnetic field lines of the microwave radiation in front of the iris opening are parallel to the z-axis, microwave magnetic field axial propagation along the z-axis is below a cutoff-condition of the coupling device so that microwave magnetic field lines parallel to the z-axis do not enter an inner volume of the coupling device, and microwave magnetic field propagation between axially neighboring loops into the inner volume of the coupling device takes place, so that local microwave magnetic field line loops around individual conductor loops are formed and link a microwave magnetic field in the first microwave structure and a microwave magnetic field in the second microwave structure via the coupling device.

* * * * *